(12) United States Patent
Kobayashi et al.

(10) Patent No.: US 10,903,351 B2
(45) Date of Patent: Jan. 26, 2021

(54) SEMICONDUCTOR DEVICE

(71) Applicant: FUJI ELECTRIC CO., LTD., Kawasaki (JP)

(72) Inventors: Yusuke Kobayashi, Tsukuba (JP); Shinsuke Harada, Tsukuba (JP); Takahito Kojima, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 73 days.

(21) Appl. No.: 16/167,772

(22) Filed: Oct. 23, 2018

(65) Prior Publication Data
US 2019/0165164 A1    May 30, 2019

(30) Foreign Application Priority Data
Nov. 29, 2017  (JP) .................... 2017-229699

(51) Int. Cl.
| H01L 29/76 | (2006.01) |
| H01L 29/78 | (2006.01) |
| H01L 29/16 | (2006.01) |
| H01L 29/06 | (2006.01) |
| H01L 29/08 | (2006.01) |
| H01L 29/10 | (2006.01) |
| H01L 29/66 | (2006.01) |
| H01L 29/20 | (2006.01) |
| H01L 29/739 | (2006.01) |

(52) U.S. Cl.
CPC ...... H01L 29/7813 (2013.01); H01L 29/0615 (2013.01); H01L 29/0623 (2013.01); H01L 29/0692 (2013.01); H01L 29/086 (2013.01); H01L 29/0878 (2013.01); H01L 29/1095 (2013.01); H01L 29/1608 (2013.01); H01L 29/66068 (2013.01); H01L 29/7803 (2013.01); H01L 29/0696 (2013.01); H01L 29/2003 (2013.01); H01L 29/7397 (2013.01)

(58) Field of Classification Search
None
See application file for complete search history.

(56) References Cited

U.S. PATENT DOCUMENTS

| 8,022,414 | B2 * | 9/2011 | Suzuki | H01L 29/0623 257/77 |
| 8,080,858 | B2 * | 12/2011 | Hirler | H01L 29/0623 257/487 |
| 8,169,023 | B2 * | 5/2012 | Akiyama | H01L 29/1095 257/341 |
| 10,418,478 | B2 * | 9/2019 | Kojima | H01L 29/66068 |
| 2016/0247910 | A1 | 8/2016 | Suzuki et al. | |
| 2018/0040687 | A1 * | 2/2018 | Araoka | H01L 29/1608 |

FOREIGN PATENT DOCUMENTS

| JP | 2013-214658 A | 10/2013 |
| JP | 2015-072999 A | 4/2015 |

* cited by examiner

Primary Examiner — Hung K Vu

(57) ABSTRACT

A vertical MOSFET having a trench gate structure includes an n⁻-type drift layer and a p-type base layer formed by epitaxial growth. In n⁻-type drift layer, an n-type region, a lower second p⁺-type region and a first p⁺-type region are provided. A part of the lower second p⁺-type region extending in a direction opposite that of a depth of the trench and connected to the p-type base layer.

3 Claims, 18 Drawing Sheets

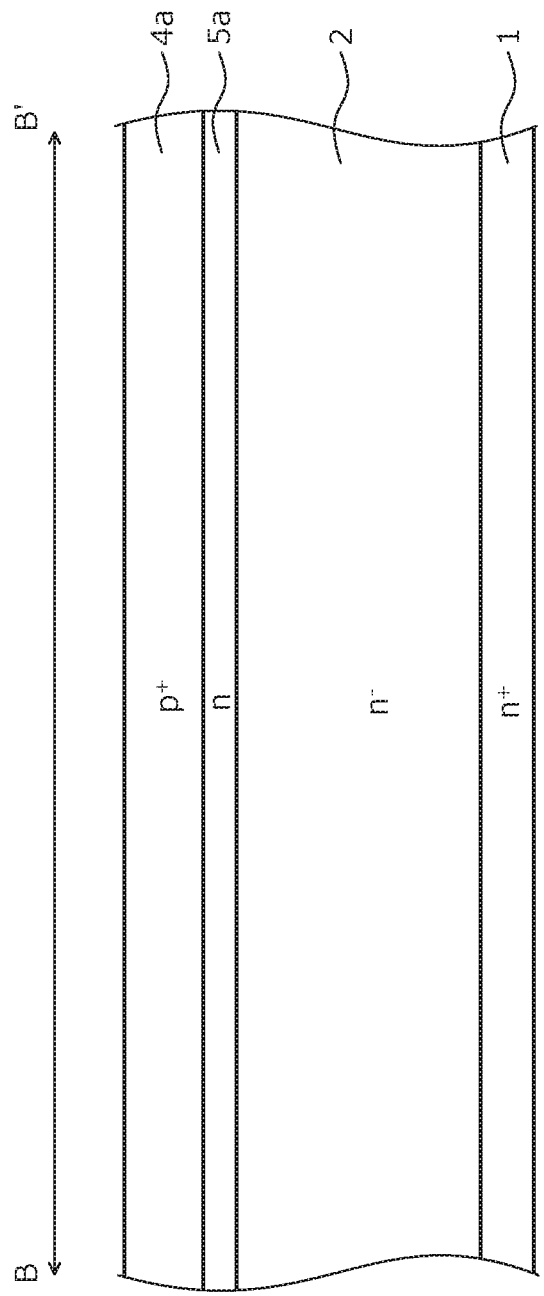

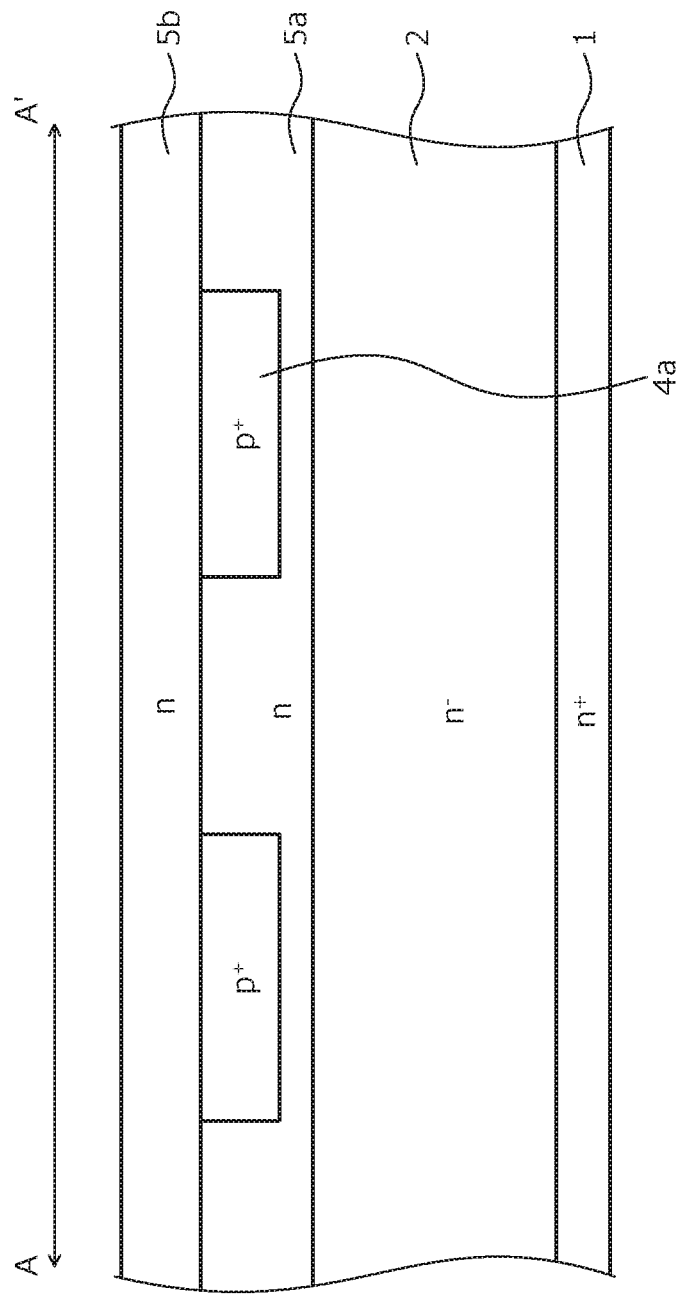

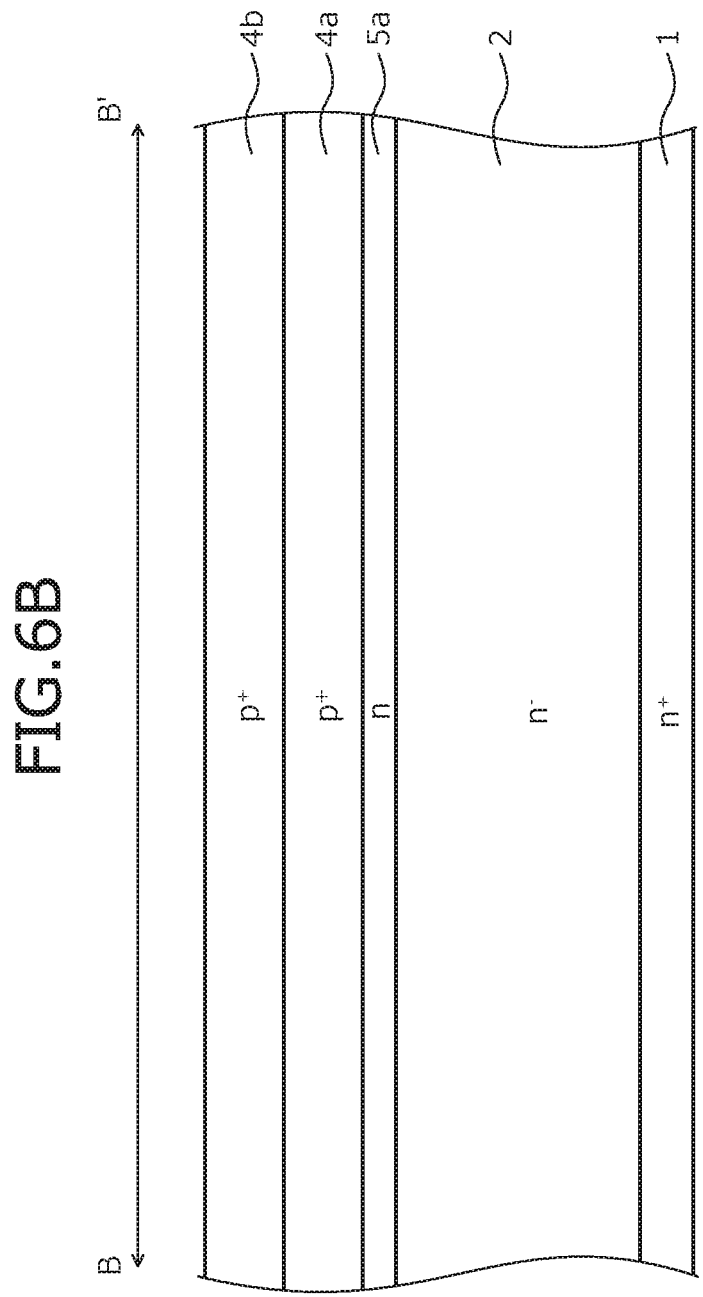

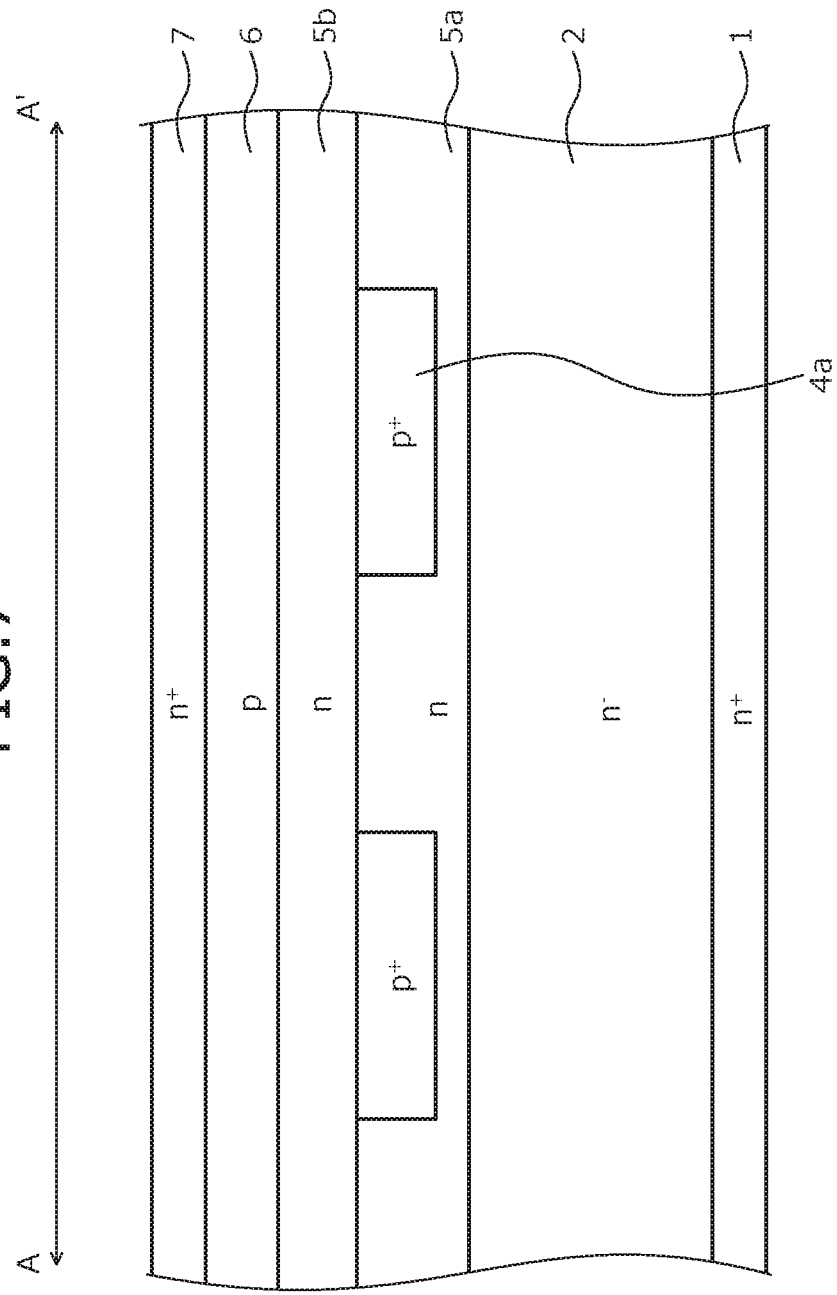

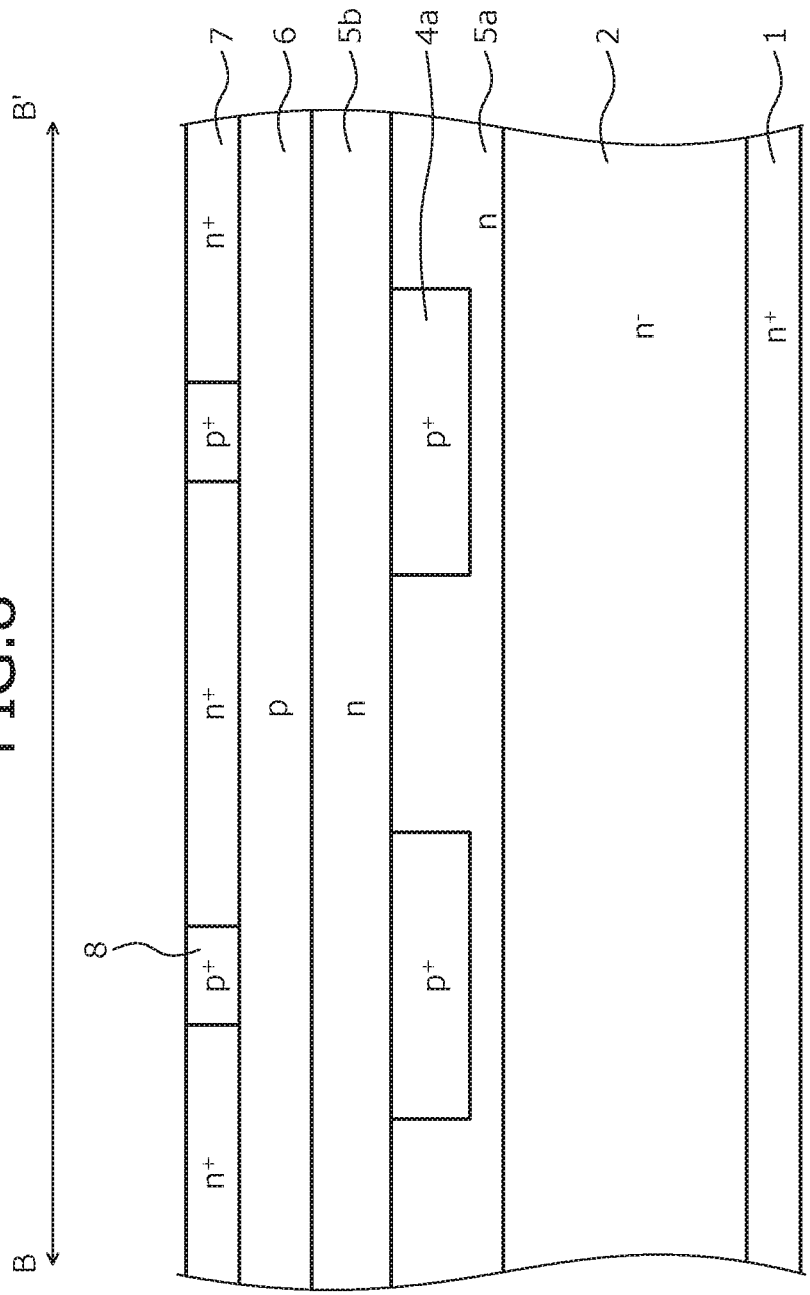

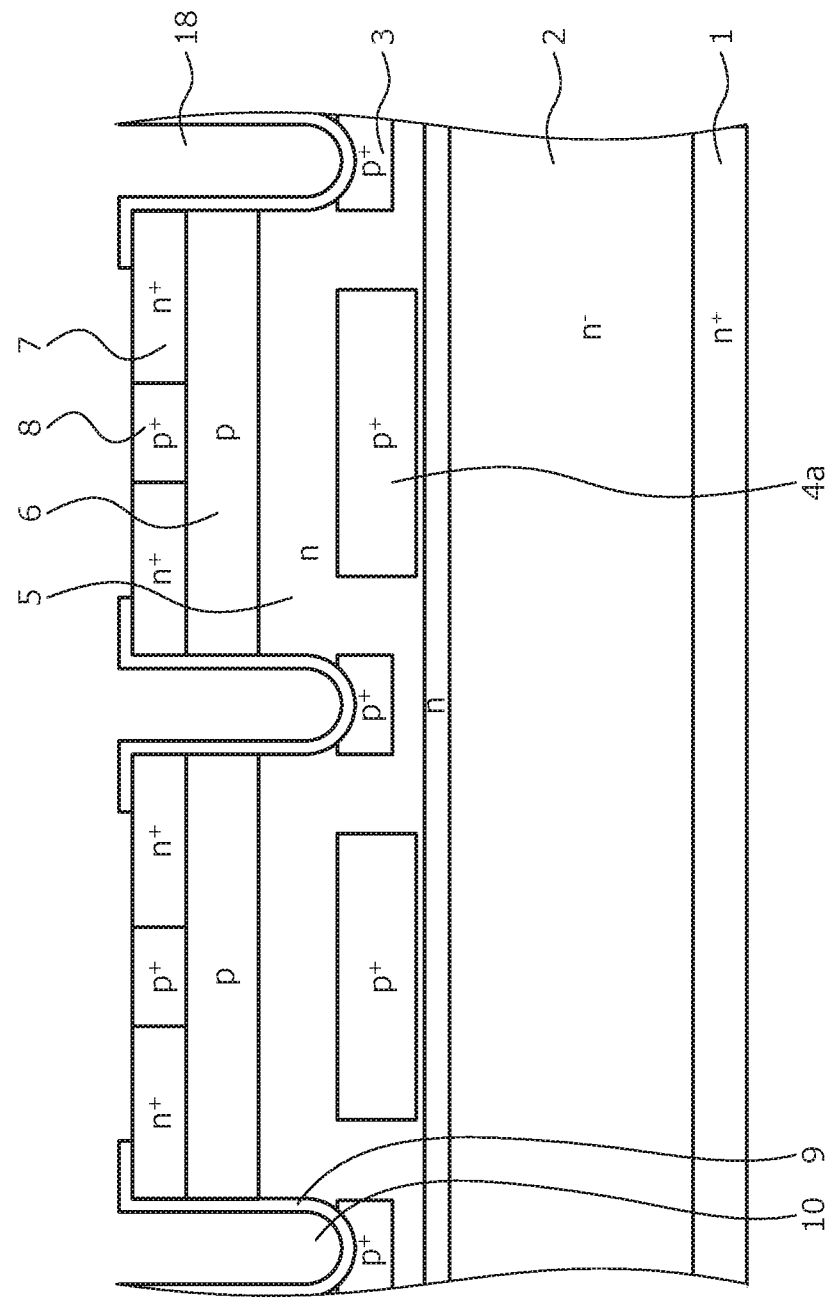

SEMICONDUCTOR DEVICE

CROSS REFERENCE TO RELATED APPLICATIONS

This application is based upon and claims the benefit of priority of the prior Japanese Patent Application No. 2017-229699, filed on Nov. 29, 2017, the entire contents of which are incorporated herein by reference.

BACKGROUND

1. Field

Embodiments of the invention relate to a semiconductor device.

2. Description of Related Art

Conventionally, to reduce the ON resistance of an element in a power semiconductor device, a vertical metal oxide semiconductor field effect transistor (MOSFET) having a trench structure is produced (manufactured). In the vertical MOSFET, the trench structure in which a channel is formed orthogonal to a substrate surface enables the cell density per unit area to be increased to a greater extent as compared to a planar structure in which the channel is formed parallel to the substrate surface. Therefore, with the trench structure, the current density per unit area may be increased, which is advantageous from the perspective of cost.

Nonetheless, when the trench structure is formed in the vertical MOSFET, the structure is such that an entire region of the inner walls of the trench are covered by a gate insulating film to form a channel in an orthogonal direction. A portion of the gate insulating film at a bottom of the trench is near a drain electrode and therefore, this portion of the gate insulating film is easily subjected to high electric field. In particular, since ultrahigh voltage elements are produced with a wide bandgap semiconductor material (semiconductor material having a wider bandgap than that of silicon such as silicon carbide (SiC)), adverse effects on the gate insulating film at the bottom of the trench significantly reduce reliability.

As a method of solving such problems, a technique has been proposed in which in a vertical MOSFET having a trench structure that has a striped flat pattern, a p$^+$-type base region is provided between trenches and has a striped shape parallel to the trenches; and a p$^+$-type base region is provided at each trench bottom and has a striped shape parallel to the trenches (for example, refer to Japanese Laid-Open Patent Publication No. 2015-72999).

FIG. 13 is a cross-sectional view of a structure of a conventional silicon carbide semiconductor device. The conventional silicon carbide semiconductor device depicted in FIG. 13 includes a MOS gate having a general trench gate structure at a front surface (surface at which a p-type base layer 106 is provided) side of a semiconductor base (hereinafter, silicon carbide base) 1100 that contains silicon carbide. The silicon carbide base (semiconductor chip) 1100 is formed by sequentially forming by epitaxial growth on an n$^+$-type starting substrate (hereinafter, n$^+$-type silicon carbide substrate) 101 that contains silicon carbide, silicon carbide layers constituting an n$^-$-type drift layer 102, an n-type region 105 that is a current spreading region, and the p-type base layer 106.

In the n-type region 105, a first p$^+$-type region 103 is selectively provided so as to underlie a bottom of a trench 1018 entirely. The first p$^+$-type region 103 is provided at a depth not reaching the n$^-$-type drift layer 102. Further, in the n-type region 105, a lower second p$^+$-type region 104a and an upper second p$^+$-type region 104b are selectively provided between (mesa part) adjacent trenches 1018. The lower second p$^+$-type region 104a and the first p$^+$-type region 103 may be formed concurrently. The upper second p$^+$-type region 104b is provided so as to be in contact with the p-type base layer 106. Reference numerals 107, 108, 109, 1010, 1011, and 1012 are an n$^+$-type source region, a p$^+$-type contact region, a gate insulating film, a gate electrode, an interlayer insulating film, and a source electrode, respectively.

The first p$^+$-type region 103, the lower second p-type region 104a, and the upper second p$^+$-type region 104b, for example, are formed by multi-stage epitaxial growth as described. First, on the n$^-$-type drift layer 102, a lower n-type region 105a is formed by epitaxial growth. Next, by photolithography and ion implantation of a p-type impurity, the first p$^+$-type region 103 and the lower second p$^+$-type region 104a are selectively formed in a surface layer of the lower n-type region 105a. Next, an upper n-type region 105b is formed by epitaxial growth on the lower n-type region 105a and the lower second p$^+$-type region 104a. Next, by photolithography and ion implantation of a p-type impurity, the upper second p$^+$-type region 104b is selectively formed in a surface layer of the upper n-type region 105b.

In the vertical MOSFET having the configuration in FIG. 13, pn junctions of the first p-type region 103 and the lower second p$^+$-type region 104a with the n-type region 105 are at positions deeper than those of the trenches 1018. Therefore, electric field concentrates at borders of the first p$^+$-type region 103 and the lower second p$^+$-type region 104a with the n-type region 105, enabling electric field concentration at the bottoms of the trenches 1018 to be mitigated.

According to another technique, to further mitigate electric field concentration, a tip of a p-type deep layer formed at a position deeper than that of the trenches is formed to have a tapered shape (for example, refer to Japanese Laid-Open Patent Publication No. 2013-214658).

SUMMARY

According to an embodiment, a semiconductor device includes a semiconductor substrate of a first conductivity type; a first semiconductor layer of the first conductivity type provided on a front surface of the semiconductor substrate and having an impurity concentration that is lower than an impurity concentration of the semiconductor substrate; a second semiconductor layer of a second conductivity type provided on a first side of the first semiconductor layer, opposite a second side of the first semiconductor layer facing toward the semiconductor substrate; a first semiconductor region of the first conductivity type selectively provided in the second semiconductor layer and having an impurity concentration that is higher than the impurity concentration of the semiconductor substrate; a trench penetrating the first semiconductor region and the second semiconductor layer, and reaching the first semiconductor layer; a gate electrode provided in the trench, via a gate insulating film; a second semiconductor region of the second conductivity type selectively provided in the first semiconductor layer; and a third semiconductor region of the second conductivity type selectively provided in the first semiconductor layer, the third semiconductor region contacting a bottom of the trench. A part of the second semiconductor region extends in a direction opposite that of a depth of the trench and is connected with the second semiconductor layer.

In the embodiment, a part of the second semiconductor region, at a lower part of the trench, extends in a direction parallel to a width of the trench and the second semiconductor regions are connected with each other.

In the embodiment, a width of the third semiconductor region is narrower than a width of the trench.

According to another embodiment, a semiconductor device includes a semiconductor substrate of a first conductivity type; a first semiconductor layer of the first conductivity type provided on a front surface of the semiconductor substrate and having an impurity concentration that is lower than an impurity concentration of the semiconductor substrate; a second semiconductor layer of a second conductivity type provided on a first surface of the first semiconductor layer, opposite a second surface of the first semiconductor layer facing toward the semiconductor substrate; a first semiconductor region of the first conductivity type selectively provided in the second semiconductor layer and having an impurity concentration that is higher than an impurity concentration of the semiconductor substrate; a trench penetrating the first semiconductor region and the second semiconductor layer, and reaching the first semiconductor layer; a gate electrode provided in the trench, via a gate insulating film; a second semiconductor region of the second conductivity type selectively provided in the first semiconductor layer; a third semiconductor region of the second conductivity type selectively provided in the first semiconductor layer, the third semiconductor region contacting a bottom of the trench; and a fourth semiconductor region of the second conductivity type selectively provided in a surface layer on the first side of the first semiconductor layer, the fourth semiconductor region contacting the second semiconductor region. A width of the fourth semiconductor region is narrower than a width of the second semiconductor region.

In the embodiment, a width of a surface of the second semiconductor region in contact with the fourth semiconductor region is narrower than a width of a surface of the second semiconductor region in contact with the first semiconductor layer.

Objects, features, and advantages of the present invention are specifically set forth in or will become apparent from the following detailed description of the invention when read in conjunction with the accompanying drawings.

BRIEF DESCRIPTION OF THE DRAWINGS

Further.

FIG. 5B is a cross-sectional view of the silicon carbide semiconductor device according to the first embodiment during manufacture;

FIG. 6A is a cross-sectional view of the silicon carbide semiconductor device according to the first embodiment during manufacture;

FIG. 6B is a cross-sectional view of the silicon carbide semiconductor device according to the first embodiment during manufacture;

FIG. 7 is a cross-sectional view of the silicon carbide semiconductor device according to the first embodiment during manufacture;

FIG. 8 is a cross-sectional view of the silicon carbide semiconductor device according to the first embodiment during manufacture;

FIG. 9 is a cross-sectional view of the silicon carbide semiconductor device according to the first embodiment during manufacture;

DESCRIPTION OF EMBODIMENTS

Figure 14:
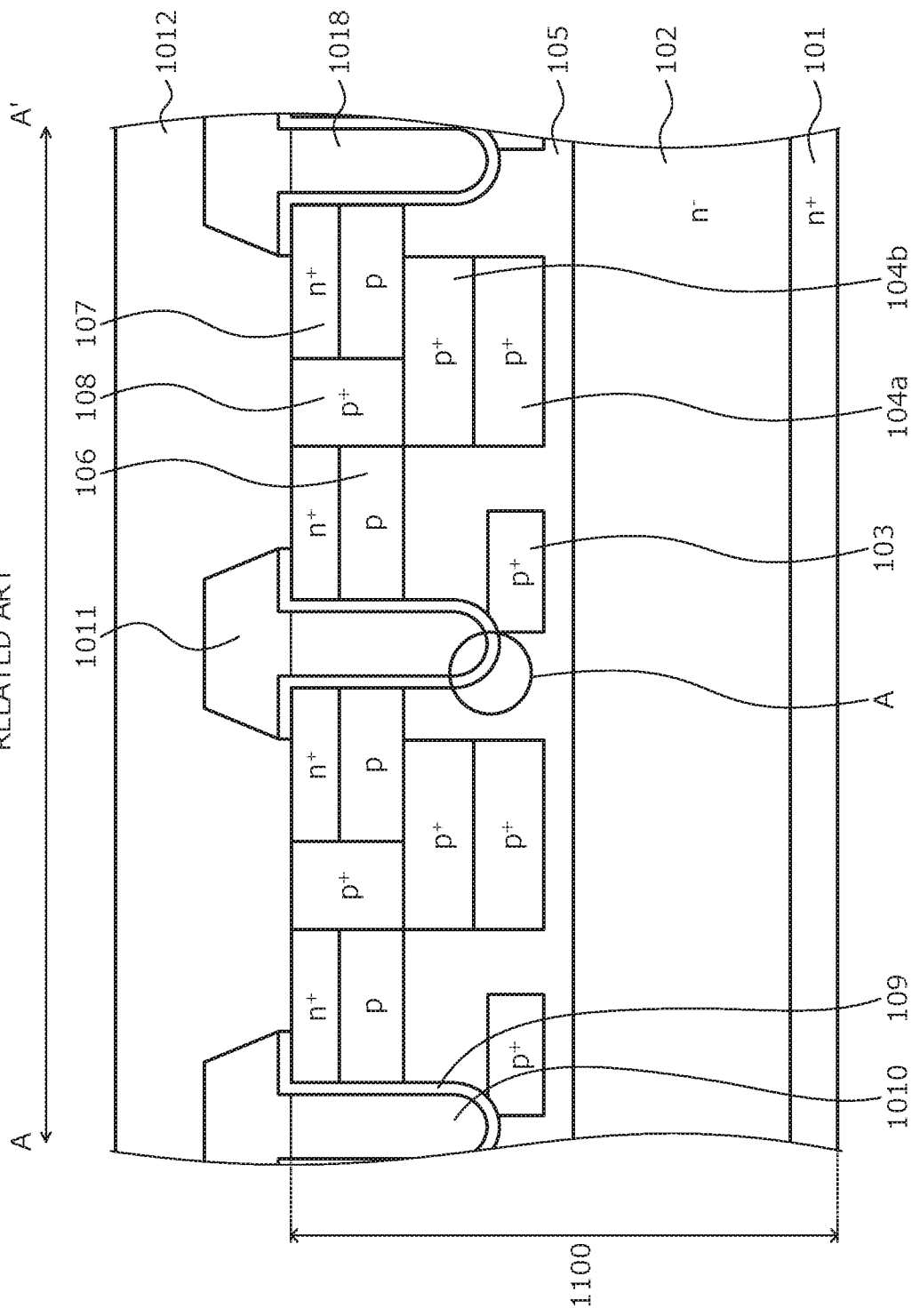
FIG. 14 is a cross-sectional view depicting a case where a first $p^+$-type region deviates in the conventional silicon carbide semiconductor device.

First, problems associated with the conventional techniques will be discussed. When the first $p^+$-type region 103, the lower second $p^+$-type region 104a, and the upper second p-type region 104b are formed by multi-stage epitaxial growth as described above, the following formation positions may deviate due to misalignment of an epitaxial layer. Here, misalignment is, for example, deviation of a mark indicating a formation position of the first $p^+$-type region 103, etc. due to an epitaxial layer. FIG. 14 is a cross-sectional view depicting a case where a first $p^+$-type region deviates in the conventional silicon carbide semiconductor device. As depicted in FIG. 14, due to deviation of the formation position of the first $p^+$-type region 103, the first $p^+$-type region 103 does not underlie the entire bottom of the trench 1018. As a result, a problem arises in that in a region indicated by reference character A in FIG. 14, the pn junction of the first $p^+$-type region 103 and the n-type region 105 is not formed and electric field concentrates at the bottom of the trench 1018.

Figure 15:
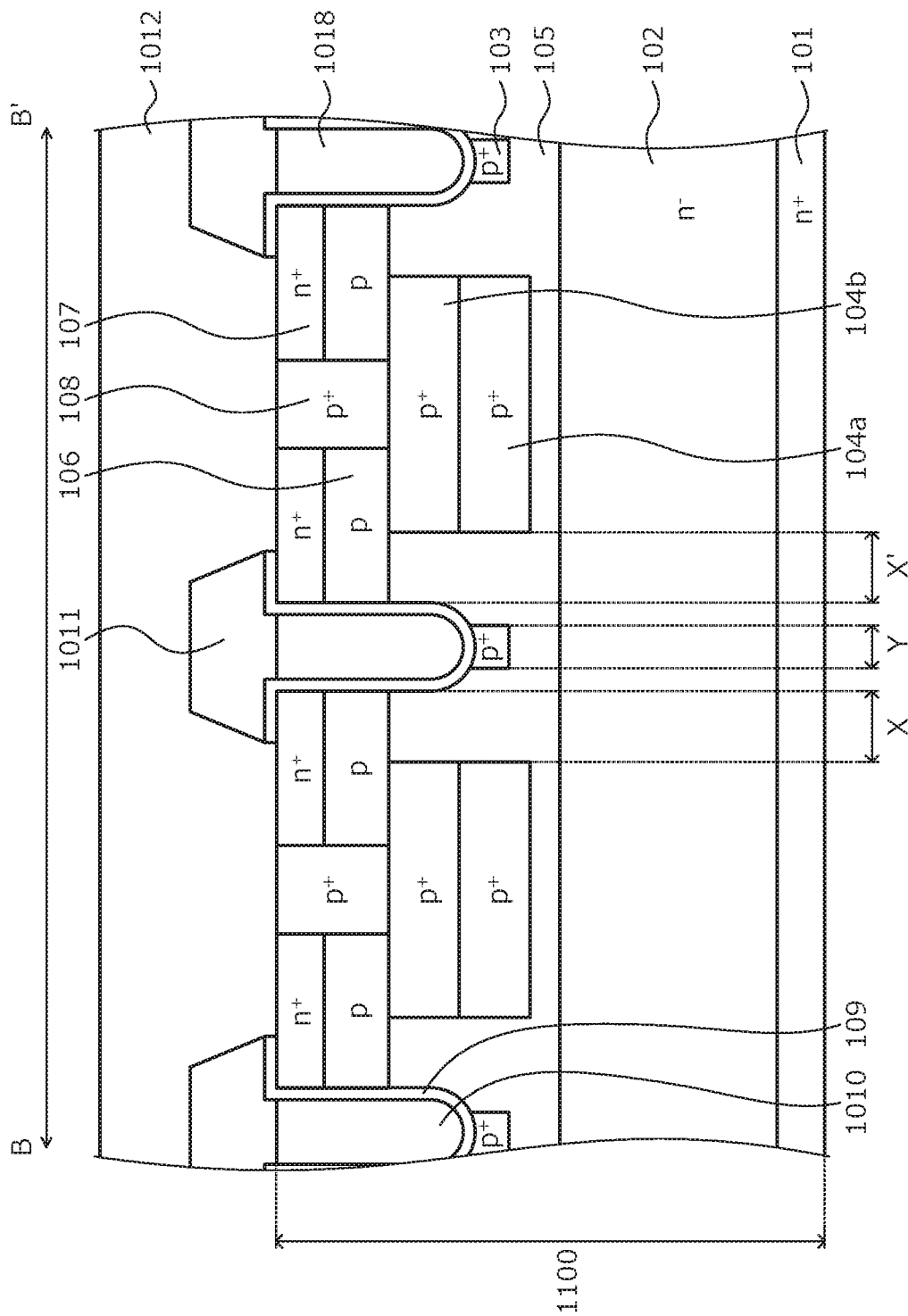
FIG. 15 is a cross-sectional view of a structure of a silicon carbide semiconductor device in which the first p-type region is formed by self-alignment.

To solve this problem, one method forms the first $p^+$-type region 103 by self-alignment with the trench 1018. FIG. 15 is a cross-sectional view of a structure of a silicon carbide semiconductor device in which the first $p^+$-type region is formed by self-alignment. For example, the first $p^+$-type region 103 is formed as follows. First, by photolithography and etching, the trench 1018 is formed penetrating the n⁺-type source region 107 and the p-type base layer 106, and reaching the n-type region 105. Next, a mask for trench formation is used to selectively form the first p⁺-type region 103 at the bottom of the trench 1018 by ion implantation of a p-type impurity.

By forming the first p⁺-type region 103 by self-alignment with the trench 1018 in this manner, the first p⁺-type region 103 is positioned at the bottom of the trench 1018, enabling electric field concentration at the bottom of the trench 1018 to be mitigated.

Figure 16:
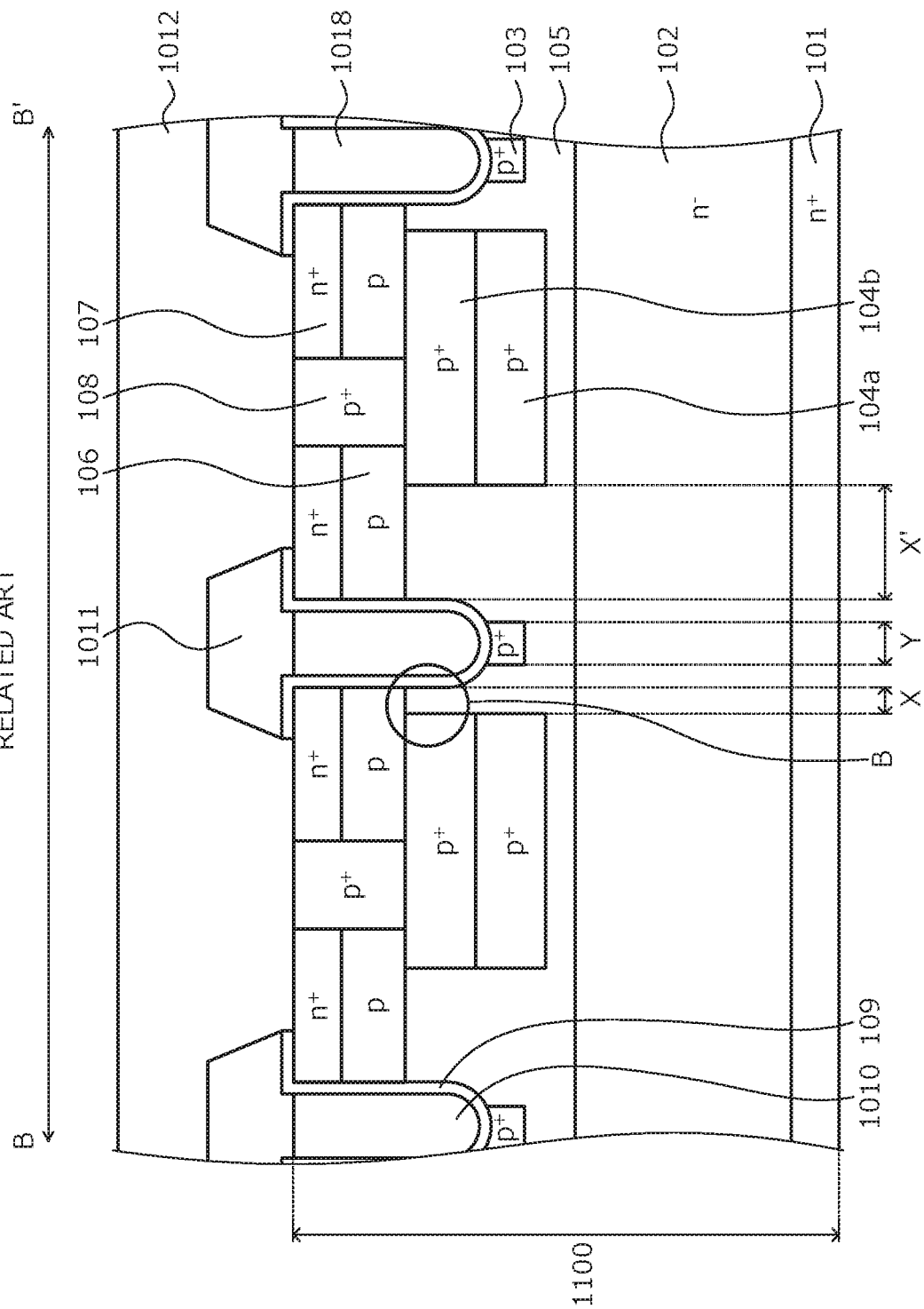
FIG. 16 is a cross-sectional view depicting a case where a second p-type region deviates in the silicon carbide semiconductor device in which the first $p^+$-type region is formed by self-alignment.

Nonetheless, even with this configuration, the formation positions of the lower second p⁺-type region 104a and the upper second p⁺-type region 104b may deviate due to misalignment of an epitaxial layer. FIG. 16 is a cross-sectional view depicting a case where a second p⁺-type region deviates in the silicon carbide semiconductor device in which the first p⁺-type region is formed by self-alignment. As depicted in FIG. 16, the formation positions of the lower second p⁺-type region 104a and the upper second p⁺-type region 104b may deviate to the left. As a result, in a region indicated by reference character B in FIG. 16, a distance X between the upper second p⁺-type region 104b and the trench 1018 becomes less than that in the case depicted in FIG. 15. Therefore, a problem arises in that parasitic resistance increases.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
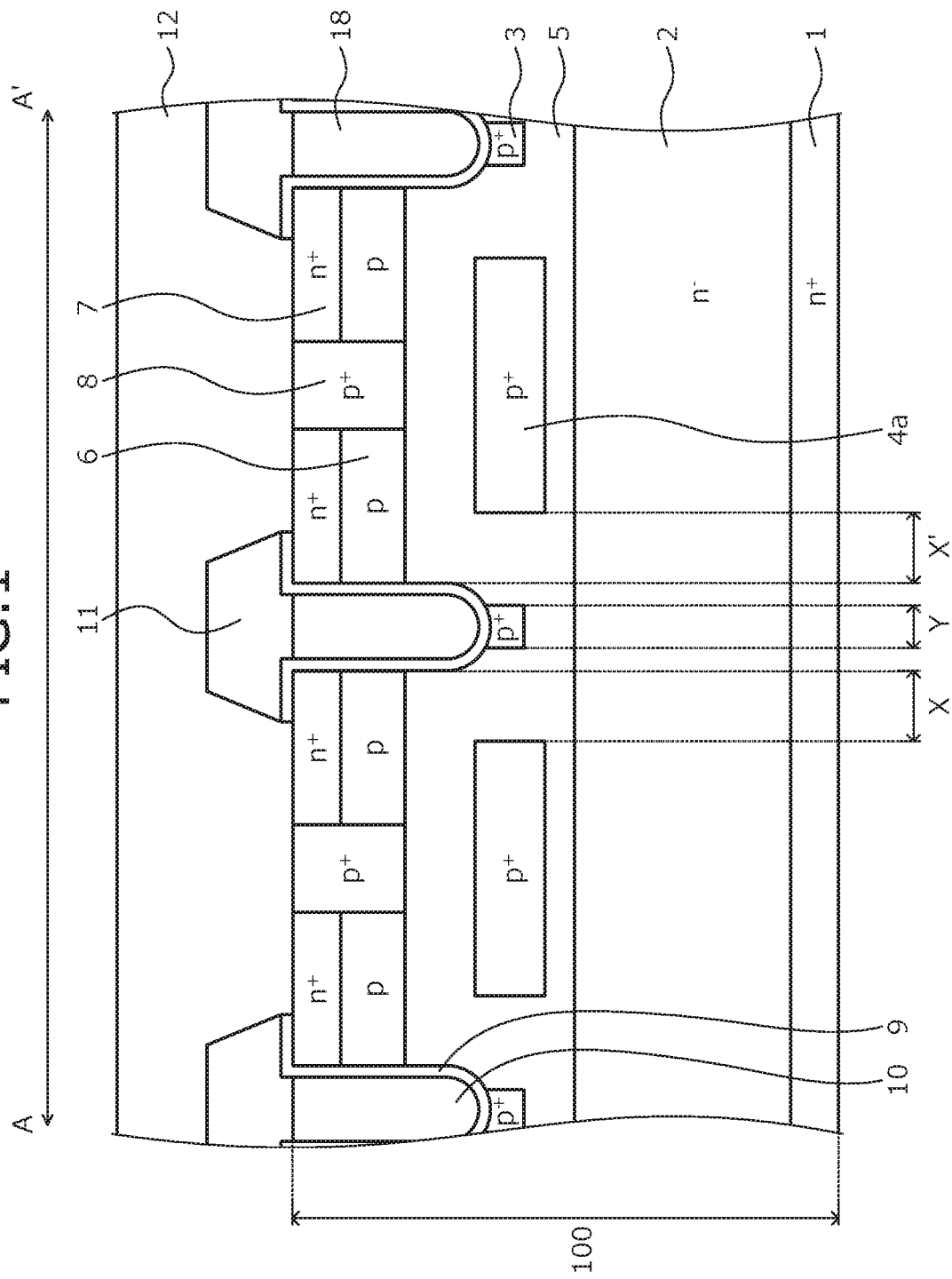
FIG. 1 is a cross-sectional view of a part of a structure of a silicon carbide semiconductor device according to a first embodiment, at cutting line A-A' in FIG. 3.
Figure 2:
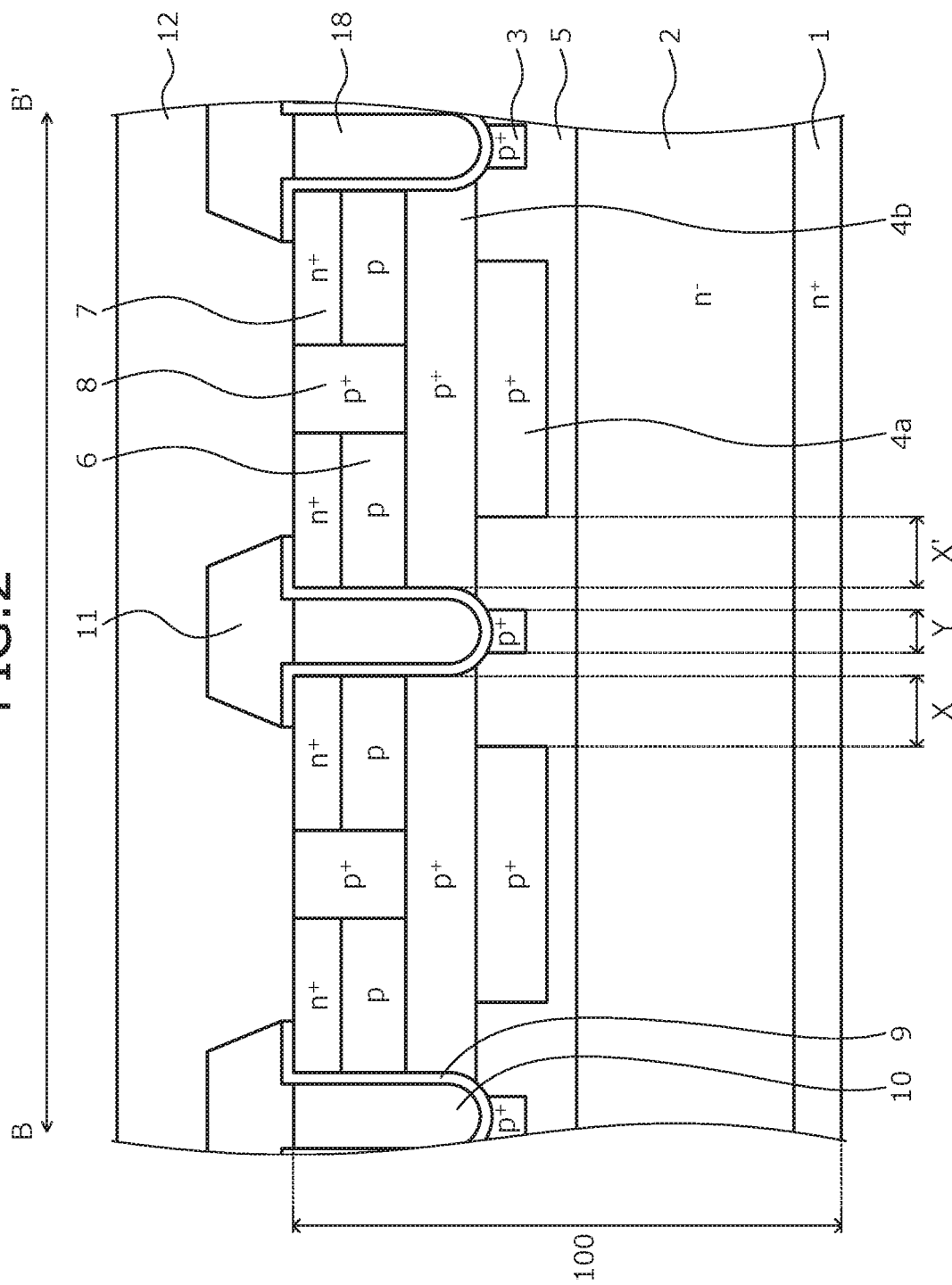
FIG. 2 is a cross-sectional view of a part the structure of the silicon carbide semiconductor device according to the first embodiment, at cutting line B-B' in FIG. 3.
Figure 3:
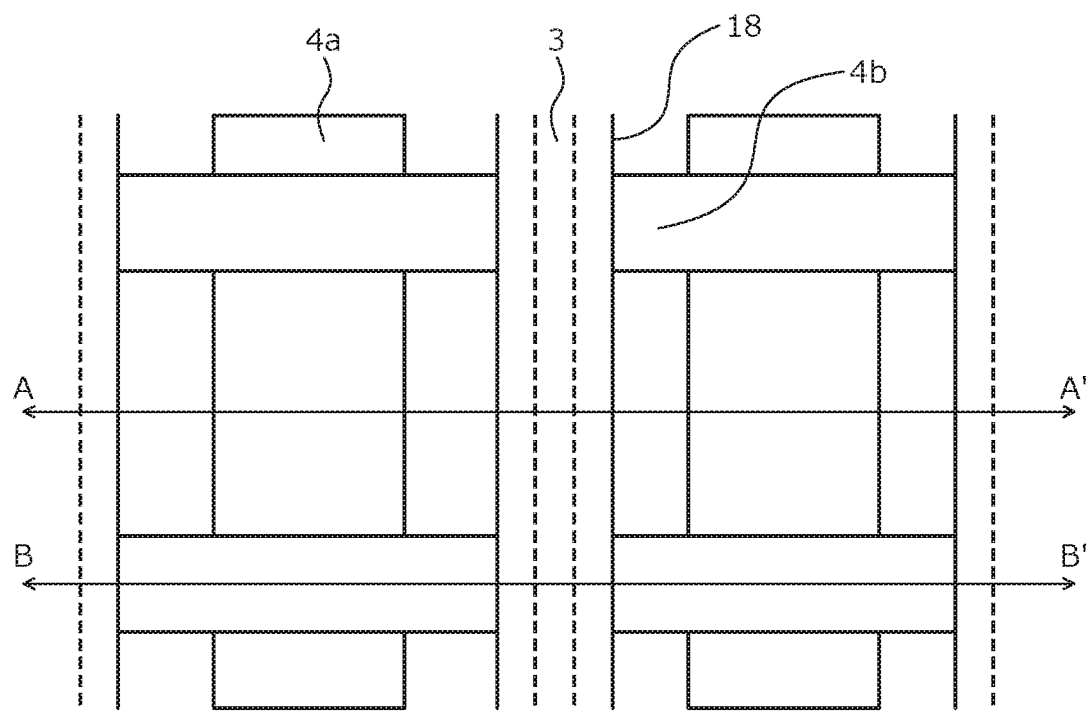
FIG. 3 is a top view of the structure of the silicon carbide semiconductor device according to the first embodiment.

The semiconductor device according to an embodiment of the present invention is configured using a semiconductor material (hereinafter, wide bandgap semiconductor material) having a bandgap wider than that of silicon. Here, description will be given taking, as an example, a structure of a semiconductor device (silicon carbide semiconductor device) that uses, for example, silicon carbide (SiC) as a wide bandgap semiconductor material. FIG. 1 is a cross-sectional view of a part of a structure of the silicon carbide semiconductor device according to a first embodiment, at cutting line A-A' in FIG. 3. Further, FIG. 2 is a cross-sectional view of a part the structure of the silicon carbide semiconductor device according to the first embodiment, at cutting line B-B' in FIG. 3. FIG. 3 is a top view of the structure of the silicon carbide semiconductor device according to the first embodiment. In FIGS. 1 to 3, only two unit cells (constituent unit of an element) are depicted and other unit cells adjacent to these are not depicted (similarly in FIGS. 10, 12). The silicon carbide semiconductor device according to the first embodiment depicted in FIGS. 1 to 3 is a MOSFET that includes a MOS gate at a front surface (surface at which a p-type base layer 6 is provided) side of a semiconductor base (silicon carbide base: semiconductor chip) 100 containing silicon carbide.

The silicon carbide base 100 is formed by sequentially forming by epitaxial growth on an n⁺-type starting substrate (semiconductor substrate of a first conductivity type) 1 containing silicon carbide, silicon carbide layers constituting an n⁻-type drift layer (first semiconductor layer of the first conductivity type) 2 and the p-type base layer (second semiconductor layer of a second conductivity type) 6. The MOS gate includes the p-type base layer 6, an n⁺-type source region (first semiconductor region of the first conductivity type) 7, a p⁺-type contact region 8, a trench 18, a gate insulating film 9, and a gate electrode 10. In particular, in a surface layer of the n⁻-type drift layer 2, on a source side (side toward a source electrode 12) of the n⁻-type drift layer 2, an n-type region 5 is provided so as to be in contact with the p-type base layer 6. The n-type region 5 is a so-called current spreading layer (CSL) that reduces carrier spreading resistance. The n-type region 5, for example, is uniform along a direction parallel to a base front surface (front surface of the silicon carbide base 100).

In the n-type region 5, a first p⁺-type region 3, a lower second p⁺-type region 4a, and an upper second p⁺-type region 4b are each selectively provided. The first p⁺-type region 3 is provided so as to be in contact with the trench 18 described hereinafter. The first p⁺-type region 3 is provided at a depth not reaching an interface of the n-type region 5 and the n⁻-type drift layer 2, from a deep position closer to a drain than is an interface of the p-type base layer 6 and the n-type region 5. Provision of the first p⁺-type region 3 enables a pn junction between the first p⁺-type region 3 and the n-type region 5 to be formed near the bottom of the trench 18. The first p⁺-type region 3 has an impurity concentration that is higher than an impurity concentration of the p-type base layer 6.

The first p⁺-type region 3 has a width that is equal to or less than a width of the trench 18. Therefore, the first p⁺-type region 3 may be formed by self-alignment, i.e., by using a mask used when the trench 18 is formed. In this manner, since the same mask is used, deviation (misalignment) of formation positions of the first p⁺-type region 3 and the trench 18 does not occur.

In the first embodiment, the upper second p⁺-type regions 4b are thinned out and partially provided. As depicted in FIG. 2, the upper second p⁺-type region 4b is a region of a part of the lower second p⁺-type region 4a extending to an upper side (direction opposite that of a depth of the trench 18) and connected with the p-type base layer 6. As a result, holes generated when avalanche breakdown occurs at a connection part of the lower second p⁺-type region 4a and the n-type region 5 are efficiently migrated to the source electrode 12, enabling load on the gate insulating film 9 to be reduced and reliability to be increased.

Here, FIG. 1 is a cross-sectional view of a part in which the upper second p⁺-type region 4b is not provided. FIG. 2 is a cross-sectional view of a part in which the upper second p⁺-type region 4b is provided. The lower second p⁺-type region 4a is selectively provided separated from the n⁻-type drift layer 2 and in contact with the upper second p⁺-type region 4b. An interface of the lower second p⁺-type region 4a and the upper second p⁺-type region 4b is provided closer to an upper side than is the bottom of the trench 18. The upper side is a side toward the source electrode 12.

In the part where the upper second p⁺-type region 4b is provided, the upper second p⁺-type region 4b and the lower second p⁺-type region 4a extend along a width direction (direction parallel to the trench 18) of the trench 18 so as to connect each. As a result, as depicted in FIG. 2, in the part in which the upper second p⁺-type region 4b is provided, the upper second p⁺-type region 4b and a side wall of the trench 18 are in contact with each other, and in this region, no channel is formed and even in the ON state, no current flows.

In this manner, the upper second p⁺-type regions 4b are thinned out and partially provided and in a region in which a channel is formed, the upper second p⁺-type region 4b is not provided. Therefore, when the lower second p$^+$-type region 4a and the upper second p$^+$-type region 4b are formed, even when misalignment due to multi-stage epitaxial growth occurs, in a region in which a channel is formed, the upper second p$^+$-type region 4b is not provided and therefore, a distance between the upper second p$^+$-type region 4b and the trench 18 does not decrease and thus, the parasitic resistance does not increase.

Further, in the p-type base layer 6, the n$^+$-type source region 7 and the p-type contact region 8 are each selectively provided so as to be in contact with each other. The p$^+$-type contact region 8 has a depth that, for example, may be equal to or deeper than a depth of the n$^+$-type source region 7.

The trench 18 penetrates the n$^+$-type source region 7 and the p-type base layer 6 from the base front surface and reaches the n-type region 5. In the trench 18, the gate insulating film 9 is provided along the sides wall of the trench 18 and the gate electrode 10 is provided on the gate insulating film 9. An end of the gate electrode 10 toward the source may or may not protrude outside from the base front surface. The gate electrode 10 is electrically connected to a gate pad (not depicted) at a non-depicted part. An interlayer insulating film 11 is provided at the base front surface overall so as to cover the gate electrode 10 embedded in the trench 18.

The source electrode 12 is in contact with the n$^+$-type source region 7 and the p$^+$-type contact region 8 through a contact hole opened in the interlayer insulating film 11, and is electrically insulated from the gate electrode 10 by the interlayer insulating film 11. Between the source electrode 12 and the interlayer insulating film 11, for example, a barrier metal may be provided that prevents diffusion of metal atoms from the source electrode 12 toward the gate electrode 10. On the source electrode 12, a source electrode pad (not depicted) is provided. At a rear surface (rear surface of an n$^+$-type silicon carbide substrate 1 constituting an n$^+$-type drain region) of the silicon carbide base 100, a drain electrode (not depicted) is provided.

Figure 4:
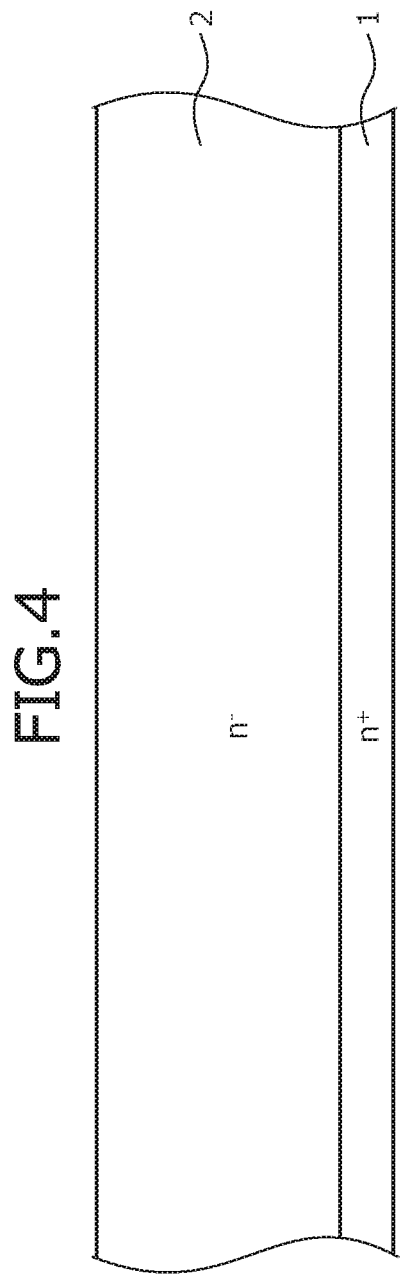
FIG. 4 is a cross-sectional view of the silicon carbide semiconductor device according to the first embodiment during manufacture.

A method of manufacturing the semiconductor device according to the first embodiment will be described. FIGS. 4, 5A, 5B, 6A, 6B, 7, 8, and 9 are cross-sectional views of the silicon carbide semiconductor device according to the first embodiment during manufacture. First, the n$^+$-type silicon carbide substrate 1 constituting the n$^+$-type drain region is prepared. Next, on the front surface of the n$^+$-type silicon carbide substrate 1, the n$^-$-type drift layer 2 described above is formed by epitaxial growth. For example, conditions of the epitaxial growth for forming the n$^-$-type drift layer 2 may be set so that an impurity concentration of the n$^-$-type drift layer 2 becomes about $3\times10^{15}/cm^3$. The state up to here is depicted in FIG. 4.

Figure 5A:
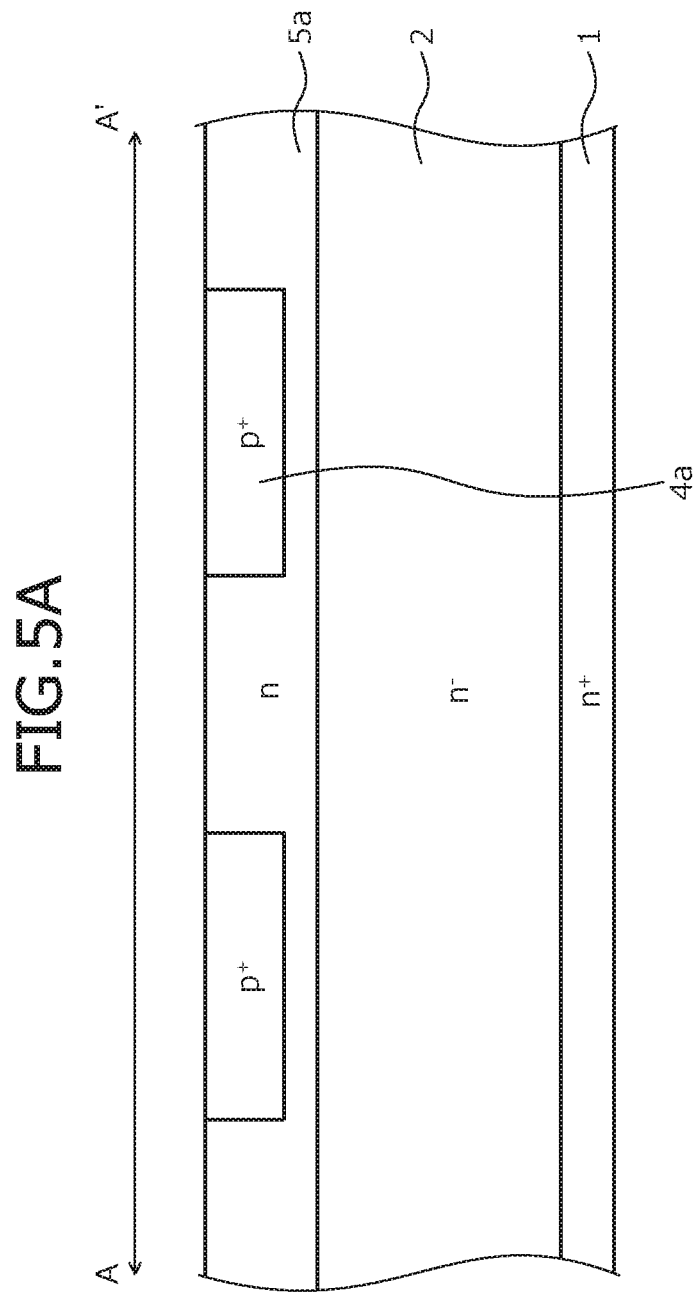
FIG. 5A is a cross-sectional view of the silicon carbide semiconductor device according to the first embodiment during manufacture.

Next, on the n$^-$-type drift layer 2, the lower n-type region 5a is formed by epitaxial growth. For example, conditions of the epitaxial growth for forming the lower n-type region 5a may be set so that an impurity concentration of the lower n-type region 5a becomes about $1\times10^{17}/cm^3$. The lower n-type region 5a is a part of the n-type region 5. Next, by photolithography and ion implantation of a p-type impurity, in a surface layer of the lower n-type region 5a, the lower second p$^+$-type region 4a is selectively formed. For example, a dose amount at the time of ion implantation for forming the lower second p$^+$-type region 4a may be set so that an impurity concentration of the lower second p$^+$-type region 4a becomes about $5\times10^{18}/cm^3$. The state up to here is depicted in FIGS. 5A and 5B. Here, FIG. 5A is a cross-sectional view of a part at cutting line A-A' depicted in FIG. 3. FIG. 5B is a cross-sectional view of a part at cutting line B-B' depicted in FIG. 3.

Next, on the lower n-type region 5a and the lower second p$^+$-type region 4a, the upper n-type region 5b is formed by epitaxial growth. For example, conditions of the epitaxial growth for forming the upper n-type region 5b may be set so that an impurity concentration of the upper n-type region 5b becomes about equal to the impurity concentration of the lower n-type region 5a. The upper n-type region 5b is a part of the n-type region 5; and the lower n-type region 5a and the upper n-type region 5b combined, form the n-type region 5. Next, by photolithography and ion implantation of a p-type impurity, in a surface layer of the upper n-type region 5b, the upper second p$^+$-type region 4b is selectively formed. For example, a dose amount at the time of ion implantation for forming the upper second p$^+$-type region 4b may be set so that an impurity concentration of the upper second p$^+$-type region 4b becomes about equal to the impurity concentration of the lower second p$^+$-type region 4a. The state up to here is depicted in FIGS. 6A and 6B. Here, FIG. 6A is a cross-sectional view of a part at cutting line A-A' depicted in FIG. 3; and FIG. 6B is a cross-sectional view of a part at cutting line B-B' depicted in FIG. 3.

Next, on the upper n-type region 5b and the upper second p$^+$-type region 4b, the p-type base layer 6 is formed by epitaxial growth. For example, conditions of the epitaxial growth for forming the p-type base layer 6 may be set so that an impurity concentration of the p-type base layer 6 becomes about $4\times10^{17}/cm^3$. Parts formed hereinafter are identical to those at the parts at cutting lines A-A' and B-B' and therefore, only a cross-sectional view of a part at cutting line A-A' depicted in FIG. 3 is shown.

Next, by photolithography and ion implantation of an n-type impurity, in a surface layer of the p-type base layer 6, the n$^+$-type source region 7 is selectively formed. For example, a dose amount at the time of ion implantation for forming the n$^+$-type source region 7 may be set so that the impurity concentration of the n$^+$-type source region 7 becomes about $3\times10^{20}/cm^3$. The state up to here is depicted in FIG. 7.

Next, by photolithography and ion implantation of a p-type impurity, in the surface layer of the p-type base layer 6, the p$^+$-type contact region 8 is selectively formed so as to be in contact with the n$^+$-type source region 7. For example, a dose amount at the time of ion implantation for forming the p$^+$-type contact region 8 may be set so that an impurity concentration of the p$^+$-type contact region 8 becomes about $3\times10^{20}/cm^3$. A sequence in which the n$^+$-type source region 7 and the p$^+$-type contact region 8 are formed may be interchanged. After all ion implantations have been completed, activation annealing is performed. The state up to here is depicted in FIG. 8.

Next, by photolithography and etching, the trench 18 is formed penetrating the n$^+$-type source region 7 and the p-type base layer 6, and reaching the n-type region 5. Next, the mask used at the time of trench formation is used in an ion implantation of a p-type impurity, whereby the first p$^+$-type region 3 is selectively formed at the bottom of the trench 18. Here, the first p$^+$-type region 3 is provided so that the first p$^+$-type region 3 is not in contact with the lower n-type region 5a. For example, a dose amount at the time of ion implantation for forming the first p$^+$-type region 3 may be set so that an impurity concentration of the first p$^+$-type region 3 becomes about equal to the impurity concentration of the lower second p$^+$-type region 4a. Further, an oxide film is used as the mask used at the time of trench formation.

Further, after trench etching, isotropic etching for removing damage of the trench 18 and/or hydrogen annealing for rounding corners of the bottom and an open part of the trench 18 may be performed. Any one of isotropic etching and hydrogen annealing may be performed. Further, hydrogen annealing may be performed after isotropic etching is performed. The state up to here is depicted in FIG. 9.

Next, along the front surface of the silicon carbide base 100 and an inner wall of the trench 18, the gate insulating film 9 is formed. Next, for example, poly-silicon is deposited and etched so as to be embedded in the trench 18, whereby the poly-silicon constituting the gate electrode 10 is left in the trench 18. At this time, etching may be performed so that the poly-silicon remains inside below a base surface part, or patterning and etching may be performed, whereby the poly-silicon protrudes outside from the base surface part.

Next, the interlayer insulating film 11 is formed on the entire front surface of the silicon carbide base 100 so as to cover the gate electrode 10. The interlayer insulating film 11, for example, may be formed by a non-doped silicate glass (NSG), a phosphosilicate glass (PSG), a borophosphosilicate glass (BPSG), a high temperature oxide (HTO), or a combination thereof. Next, the interlayer insulating film 11 and the gate insulating film 9 are patterned and a contact hole is formed, exposing the $n^+$-type source region 7 and the $p^+$-type contact region 8.

Next, the barrier metal is formed and pattered so as to cover the interlayer insulating film 11 and again expose the $n^+$-type source region 7 and the $p^+$-type contact region 8. Next, the source electrode 12 is formed so as to be in contact with the $n^+$-type source region 7. The source electrode 12 may be formed so as to cover the barrier metal, or may be left only in the contact hole.

Next, the source electrode pad is formed so as to be embedded in the contact hole. A part of a metal layer deposited to form the source electrode pad may be used as a gate pad. At the rear surface of the $n^+$-type silicon carbide substrate 1, a metal film such as a nickel (Ni) film, a titanium (Ti) film, etc. is formed at a contact part of the drain electrode (not depicted) by sputtering deposition, etc. The metal film may be a stacked combination of one or more Ni films and Ti films. hereafter, annealing such as rapid thermal annealing (RTA), etc. is performed converting the metal film into a silicide and forming an ohmic contact. Thereafter, for example, a thick film such as a stacked film in which a Ti film, a Ni film, and a gold (Au) are sequentially stacked is formed by electron beam (EB) deposition, forming the drain electrode.

In the epitaxial growth and ion implantations above, as an n-type impurity (n-type dopant), for example, nitrogen (N), phosphorus (P), arsenic (As), antimony (Sb), etc. that are n-types with respect to silicon carbide is used. As a p-type impurity (p-type dopant), for example, boron (B), aluminum (Al), gallium (Ga), indium (In), thallium (Tl), etc. that are p-types with respect to silicon carbide is used. In this manner, the MOSFET depicted in FIGS. 1 and 2 is completed.

As described according to the first embodiment, the upper second $p^+$-type regions are thinned out and partially provided and in the region in which the channel is formed, the upper second $p^+$-type region is not provided. As a result, even when misalignment due to multi-stage epitaxial growth occurs, in the region in which a channel is formed, the distance between the upper second $p^+$-type region and the trench does not decrease and thus, the parasitic resistance does not increase.

Figure 10:
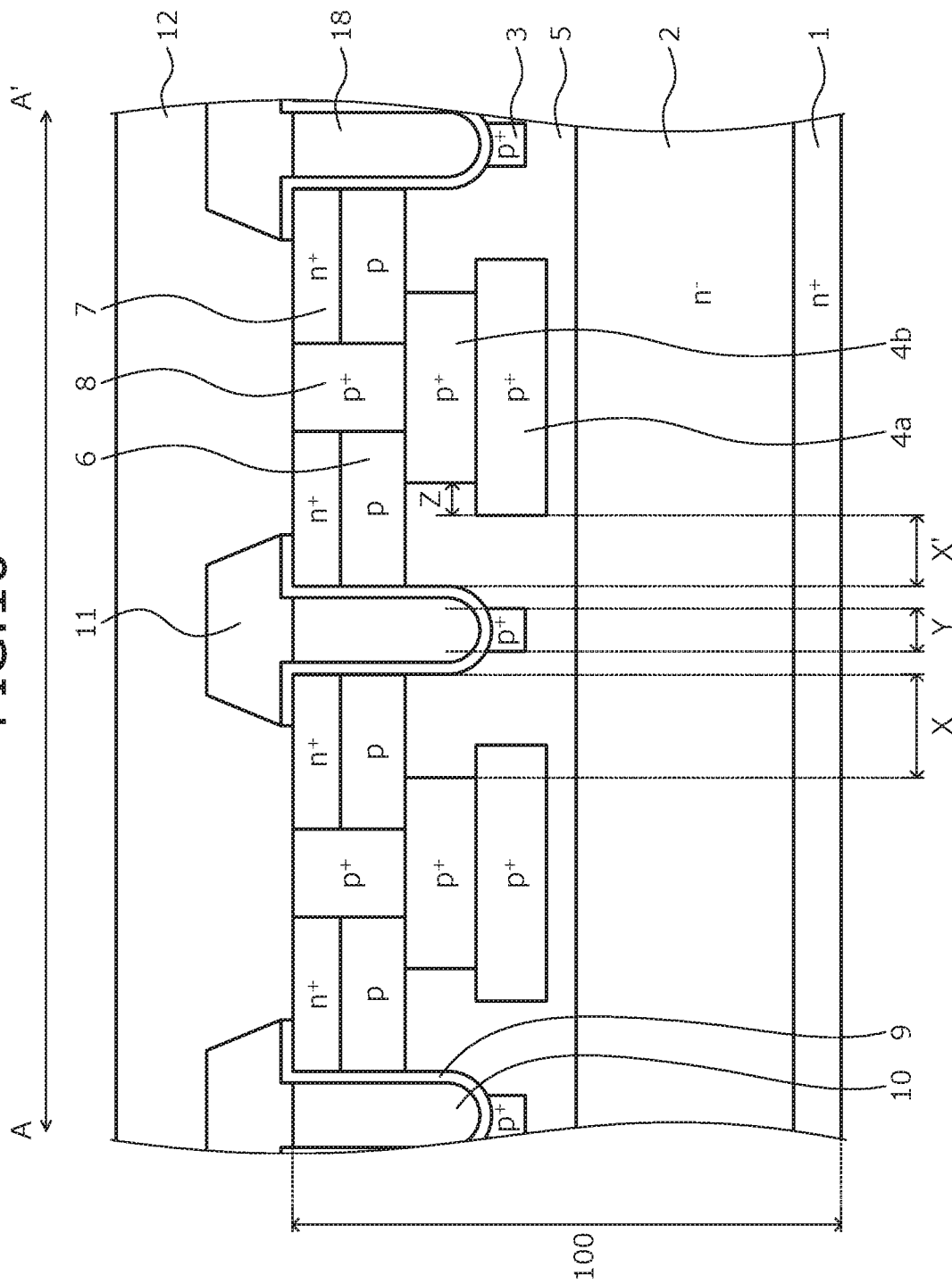
FIG. 10 is a cross-sectional view of a structure of the silicon carbide semiconductor device according to a second embodiment.

A structure of the silicon carbide semiconductor device according to a second embodiment will be described. FIG. 10 is a cross-sectional view of a structure of the silicon carbide semiconductor device according to the second embodiment. The silicon carbide semiconductor device according to the second embodiment differs from the silicon carbide semiconductor device according to the first embodiment in that the upper second $p^+$-type regions 4b are provided without being thinned out.

In the second embodiment, the width of the upper second $p^+$-type region 4b is narrower than the width of lower second $p^+$-type region 4a. For example, a distance Z from an end of the upper second $p^+$-type region 4b to an end of the lower second p-type region 4a, for example, is 0.05 to 0.4 μm. Further, the width of the lower second $p^+$-type region 4a is about equal to the width in the first embodiment to maintain the breakdown voltage.

In this manner, the width of the upper second $p^+$-type region 4b is narrow, whereby even when misalignment due to multi-stage epitaxial growth occurs, the distance X between the upper second $p^+$-type region 4b and the trench 18 in the region in which a channel is formed is sufficiently wide. In this case, while a distance X' between the lower second $p^+$-type region 4a and the trench 18 becomes narrow, in this region no channel is formed and therefore, no problem arises.

Figure 11:
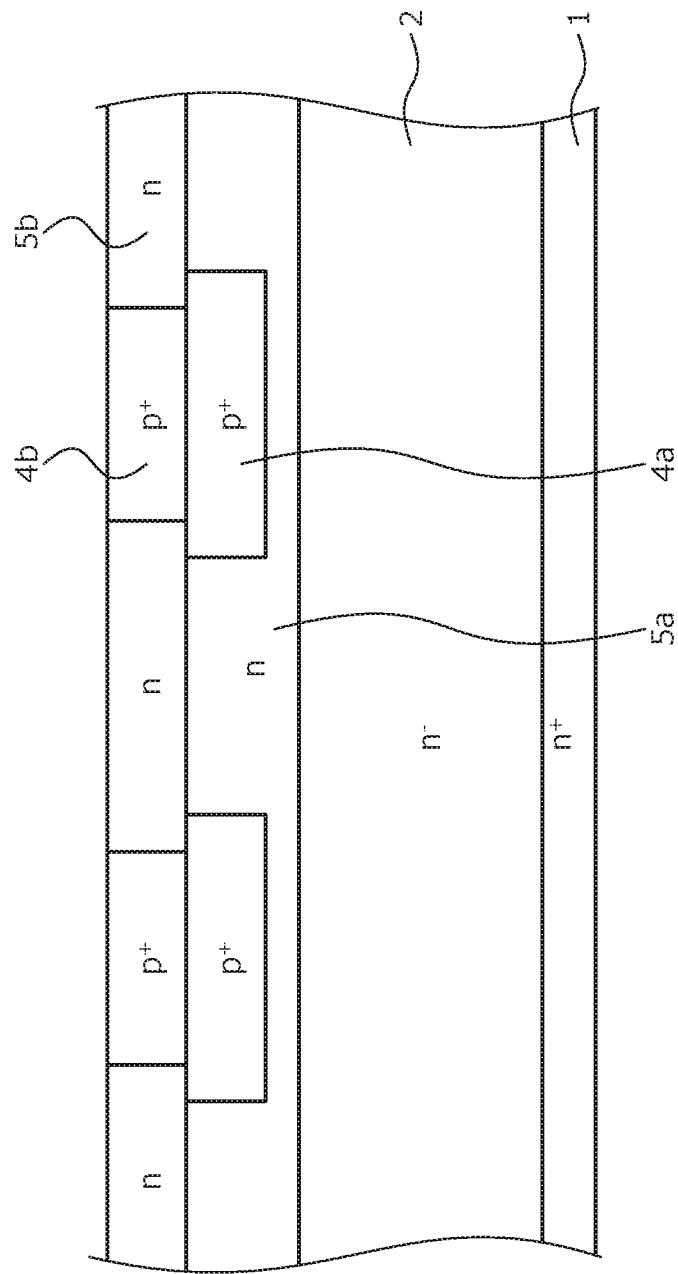
FIG. 11 is a cross-sectional view of the silicon carbide semiconductor device according to the second embodiment during manufacture.

A method of manufacturing the silicon carbide semiconductor device according to the second embodiment will be described. FIG. 11 is a cross-sectional view of the silicon carbide semiconductor device according to the second embodiment during manufacture. First, similarly to the first embodiment, processes of preparing the $n^+$-type silicon carbide substrate 1 to selectively forming the lower second $p^+$-type region 4a in the surface layer of the lower n-type region 5a are sequentially performed (refer to FIGS. 4 and 5A). Here, the lower second $p^+$-type region 4a that extends along the width direction of the trench 18 as depicted in FIG. 5B is not formed.

Next, on the lower n-type region 5a and the lower second $p^+$-type region 4a, the upper n-type region 5b is formed by epitaxial growth. Next, by photolithography and ion implantation of a p-type impurity, in the surface layer of the upper n-type region 5b, the upper second $p^+$-type region 4b is selectively formed. The state up to here is depicted in FIG. 11. Thereafter, similarly to the first embodiment, the process of forming the p-type base layer 6 by epitaxial growth and subsequent processes are sequentially performed (refer to FIGS. 7 to 9), whereby the MOSFET depicted in FIG. 10 is completed.

As described, according to the second embodiment, the width of the upper second $p^+$-type region is narrow. As a result, even when misalignment due to multi-stage epitaxial growth occurs, the distance between the upper second $p^+$-type region and the trench is sufficient and the parasitic resistance does not increase.

Figure 12:
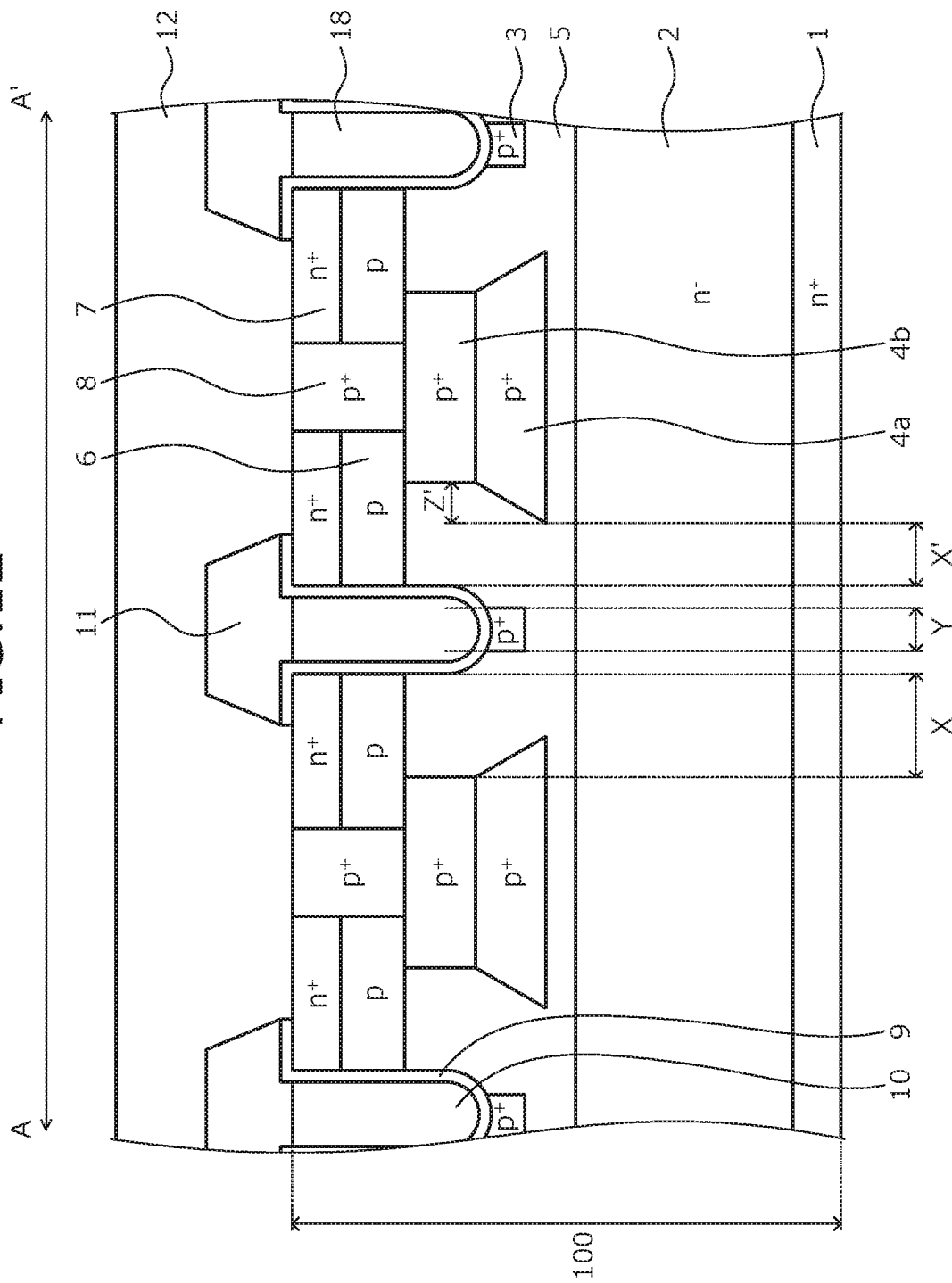
FIG. 12 is a cross-sectional view of a structure of the silicon carbide semiconductor device according to a third embodiment.
Figure 13:
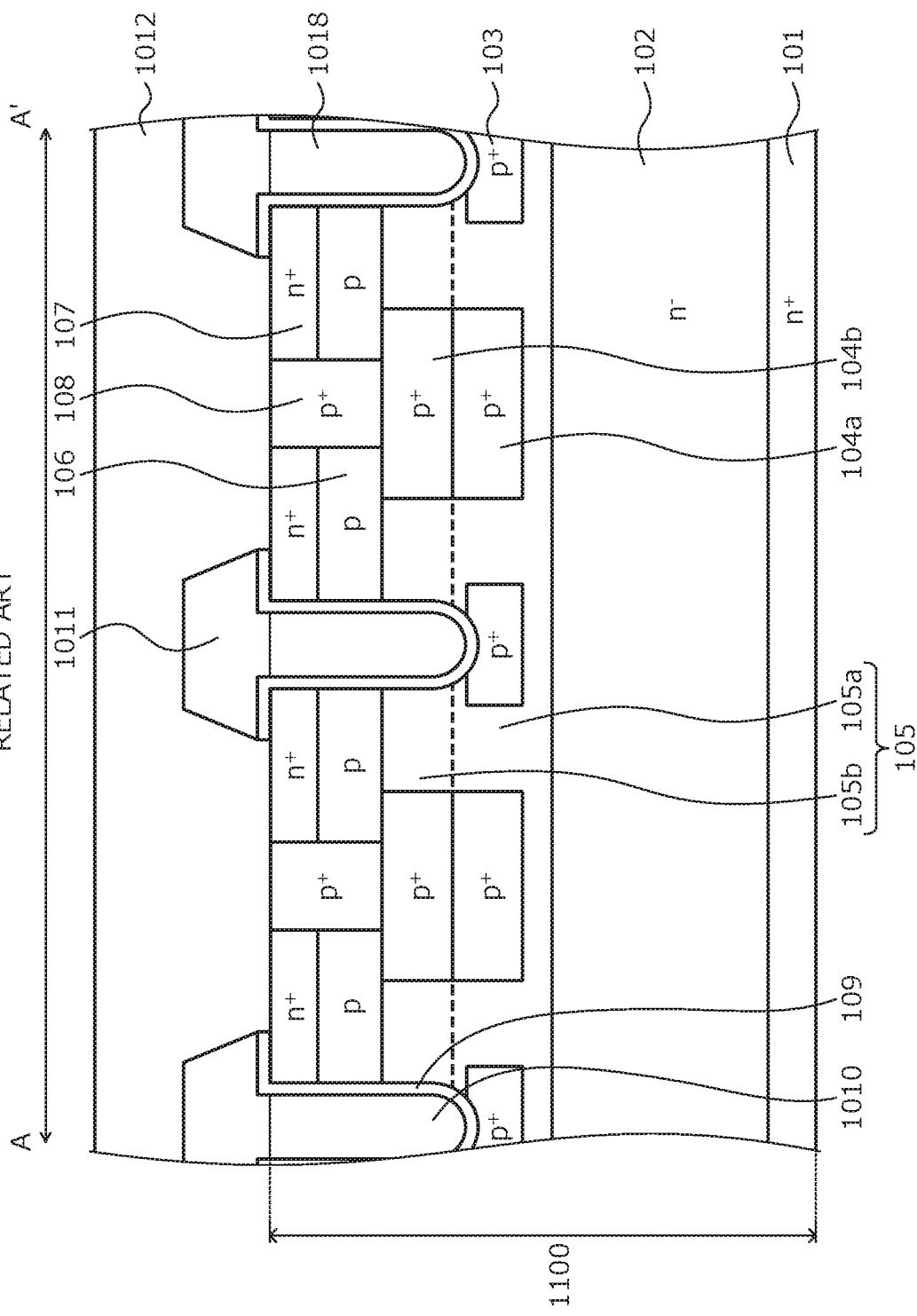
FIG. 13 is a cross-sectional view of a structure of a conventional silicon carbide semiconductor device.

A structure of the silicon carbide semiconductor device according to a third embodiment will be described. FIG. 12 is a cross-sectional view of a structure of the silicon carbide semiconductor device according to the third embodiment. The silicon carbide semiconductor device according to the third embodiment differs from the silicon carbide semiconductor device according to the second embodiment in that a width of an upper surface (surface in contact with the upper second $p^+$-type region 4b) of the lower second $p^+$-type region 4a is narrower than a width of a lower surface (surface in contact with the n-type region). Therefore, as depicted in FIG. 12, a side surface of the lower second p$^+$-type region 4a is sloped.

Further, the upper surface of the lower second p$^+$-type region 4a is equal to a width of a lower surface (surface in contact with the lower second p$^+$-type region 4a) of the upper second p$^+$-type region 4b. A distance Z' from an end of the upper surface of the lower second p$^+$-type region 4a to an end of a lower surface of the lower second p$^+$-type region 4a is, for example, 0.05 to 0.2 µm. The side surface of the lower second p$^+$-type region 4a is sloped, whereby the distance Z' may be smaller than the distance Z in the second embodiment. Further, a width of the lower surface of the lower second p$^+$-type region 4a is about equal to the width in the first embodiment to maintain the breakdown voltage.

In this manner, the width of the upper second p$^+$-type region 4b is narrow, whereby, similarly to the second embodiment, even when misalignment due to multi-stage epitaxial growth occurs, the distance X between the upper second p$^+$-type region 4b and the trench 18 in the region in which a channel is formed is sufficiently wide.

A method of manufacturing the silicon carbide semiconductor device according to the third embodiment will be described. First, similarly to the first embodiment, the processes of preparing the n$^+$-type silicon carbide substrate 1 to forming the lower n-type region 5a by epitaxial growth are sequentially performed (refer to FIG. 4). Next, by photolithography and ion implantation of a p-type impurity, in the surface layer of the lower n-type region 5a, the lower second p$^+$-type region 4a is selectively formed. At this time, for example, by oblique ion implantation, the width of the upper surface of the lower second p$^+$-type region 4a is formed to be narrower than the width of the lower surface. Thereafter, similarly to the first embodiment, the process of forming the upper n-type region 5b by epitaxial growth and subsequent processes are sequentially performed (refer to FIGS. 6 to 9), whereby the MOSFET depicted in FIG. 12 is completed.

As described, according to the third embodiment, the width of the upper second p$^+$-type region is narrow, and the width of the upper surface of the lower second p$^+$-type region is narrower than the width of the lower surface of the lower second p$^+$-type region. As a result, even when misalignment due to multi-stage epitaxial growth occurs, the distance between the upper second p$^+$-type region and the trench is sufficiently wide and the parasitic resistance does not increase.

In the embodiments of the present invention, various modifications within a range not departing from the spirit of the invention are possible. For example, dimensions, impurity concentrations, etc. of regions may be variously set according to required specifications. Further, in the embodiments, while description has been given taking a MOSFET as an example, without limitation hereto, wide application to various silicon carbide semiconductor devices in which conduction and shutoff of current is performed by gate driving control based on a predetermined gate threshold voltage is possible. As a silicon carbide semiconductor device under gate driving control, insulated gate bipolar transistor (IGBT) may be given as an example. Further, in the embodiments, while a case in which silicon carbide is used as a wide bandgap semiconductor material, application is possible to a wide bandgap semiconductor material other than silicon carbide such as gallium nitride (GaN). Further, in the embodiments, while the first conductivity type is assumed as an n-type and the second conductivity type is assumed as a p-type, the present invention is similarly implemented when the first conductivity type is a p-type and the second conductivity type is an n-type.

According to the embodiments of the present invention, the upper second p$^+$-type regions (second semiconductor regions of the second conductivity type) are thinned out and partially provided and in the region in which a channel is formed, the upper second p$^+$-type region is not provided. As a result, even when misalignment due to multi-stage epitaxial growth occurs, in the region in which a channel is formed, the distance between the upper second p$^+$-type region and the trench does not decrease and the parasitic resistance does not increase.

The semiconductor device according to the embodiments of the present invention achieve an effect in that effects of misalignment due to multi-stage epitaxial growth may be reduced.

As described, the semiconductor device according to the embodiments of the present invention are useful for power converting equipment, and power supply devices such as in various industrial machines; and is particularly suitable for silicon carbide semiconductor devices having a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a semiconductor substrate of a first conductivity type;
   a first semiconductor layer of the first conductivity type provided on a front surface of the semiconductor substrate and having an impurity concentration that is lower than an impurity concentration of the semiconductor substrate;
   a second semiconductor layer of a second conductivity type provided on a first side of the first semiconductor layer, opposite a second side of the first semiconductor layer facing toward the semiconductor substrate;
   a first semiconductor region of the first conductivity type selectively provided in the second semiconductor layer and having an impurity concentration that is higher than the impurity concentration of the semiconductor substrate;
   a trench penetrating the first semiconductor region and the second semiconductor layer, and reaching the first semiconductor layer;
   a gate electrode provided in the trench, via a gate insulating film;
   a second semiconductor region of the second conductivity type selectively provided in the first semiconductor layer; and
   a third semiconductor region of the second conductivity type selectively provided in the first semiconductor layer, the third semiconductor region contacting a bottom of the trench, wherein
   a part of a first surface of the second semiconductor region extends in a direction opposite that of a depth of the trench and is connected with the second semiconductor layer by the second semiconductor region, and
   a second part of the first surface of the second semiconductor region does not extend in the direction opposite that of the depth of the trench and is not connected to the second semiconductor layer by the second semiconductor region.

2. The semiconductor device according to claim 1, wherein
   a part of the second semiconductor region contacts a sidewall of the trench.

3. The semiconductor device according to claim 1, wherein
   a width of the third semiconductor region is narrower than a width of the trench.

* * * * *